US008710529B2

United States Patent
Chen et al.

(10) Patent No.: US 8,710,529 B2
(45) Date of Patent: Apr. 29, 2014

(54) LIGHT-EMITTING DEVICE PACKAGE STRUCTURE

(75) Inventors: Ying-Zhong Chen, New Taipei (TW); Chih-Hung Hsu, New Taipei (TW); Chia-Yun Hsu, New Taipei (TW)

(73) Assignee: Everlight Electronics Co., Ltd., Taiwan (TW)

( * ) Notice: Subject to any disclaimer, the term of this patent is extended or adjusted under 35 U.S.C. 154(b) by 10 days.

(21) Appl. No.: 13/540,612

(22) Filed: Jul. 3, 2012

(65) Prior Publication Data

US 2012/0267667 A1    Oct. 25, 2012

Related U.S. Application Data

(63) Continuation of application No. 12/691,720, filed on Jan. 21, 2010, now Pat. No. 8,247,830.

(51) Int. Cl.
*H01L 33/00*    (2010.01)

(52) U.S. Cl.
USPC ........ 257/98; 257/99; 257/100; 257/E33.059; 257/E33.067

(58) Field of Classification Search
USPC .............. 257/98, 99, 100, E33.059, E33.067
See application file for complete search history.

(56) References Cited

U.S. PATENT DOCUMENTS

| 4,742,432 | A   | * | 5/1988  | Thillays et al. ............. 361/783 |
|-----------|-----|---|---------|--------------------------------------|
| 7,859,190 | B2  | * | 12/2010 | Shi ............................. 313/512 |
| 2004/0116033 | A1 | * | 6/2004 | Ouderkirk et al. .............. 445/23 |
| 2007/0114549 | A1 | * | 5/2007 | Yu ................................. 257/98 |
| 2007/0284589 | A1 |   | 12/2007 | Ng et al. |
| 2008/0048200 | A1 |   | 2/2008  | Mueller et al. |
| 2008/0224163 | A1 | * | 9/2008 | Roth et al. ...................... 257/98 |
| 2008/0265268 | A1 | * | 10/2008 | Braune et al. .................. 257/98 |
| 2008/0303052 | A1 | * | 12/2008 | Lee et al. ........................ 257/99 |
| 2009/0008662 | A1 | * | 1/2009 | Ashdown et al. ................ 257/98 |
| 2009/0057698 | A1 | * | 3/2009 | Okamura et al. ............... 257/98 |
| 2010/0155761 | A1 | * | 6/2010 | Ota et al. ........................ 257/98 |
| 2011/0233579 | A1 | * | 9/2011 | Loh et al. ........................ 257/93 |
| 2011/0254040 | A1 | * | 10/2011 | Nagai ............................. 257/98 |

FOREIGN PATENT DOCUMENTS

| CN | 1885571    | 12/2006 |
| CN | 101047217  | 10/2007 |
| JP | 2005-251875 | 9/2005 |
| TW | 200425531  | 11/2004 |
| TW | 200633257  | 9/2006  |
| TW | M341308    | 9/2008  |
| TW | 200901514  | 1/2009  |

* cited by examiner

*Primary Examiner* — Victor A Mandala
(74) *Attorney, Agent, or Firm* — Han IP Corporation (57) ABSTRACT

A light-emitting device package structure includes a leadframe, a light-emitting device disposed on the leadframe, a plurality of wires electrically connecting the leadframe and the light-emitting device, and an encapsulant covering the light-emitting device, the wires and a part of the leadframe. The encapsulant has a gas space therein, and the gas space is disposed on the light-emitting device, wherein the gas space includes at least one gas.

19 Claims, 11 Drawing Sheets

LIGHT-EMITTING DEVICE PACKAGE STRUCTURE

CROSS-REFERENCE TO RELATED APPLICATIONS

This application is a continuation of U.S. patent application Ser. No. 12/691,720, filed on Jan. 21, 2010, which claims the priority benefit of Taiwan Patent Application Serial No. 098102931, filed on Jan. 23, 2009. The above-identified applications are herein incorporated by reference in their entirety.

TECHNICAL FIELD

The present invention relates to a light-emitting device package structure and a manufacturing method thereof, and more particularly, to a light-emitting device package structure with gas space and a manufacturing method thereof.

BACKGROUND

Conventional fairy lights that decorate Christmas trees are composed of many light bulbs, and require being uniformly disposed on the Christmas trees so as to exhibit the appearance of the Christmas trees at night. However, with the development of package technology, LEDs that have the advantages of small size, high shock resistance, low power consumption, long lifetime, no warm up time and fast response time have gradually replaced the conventional light bulbs.

Figure 1:
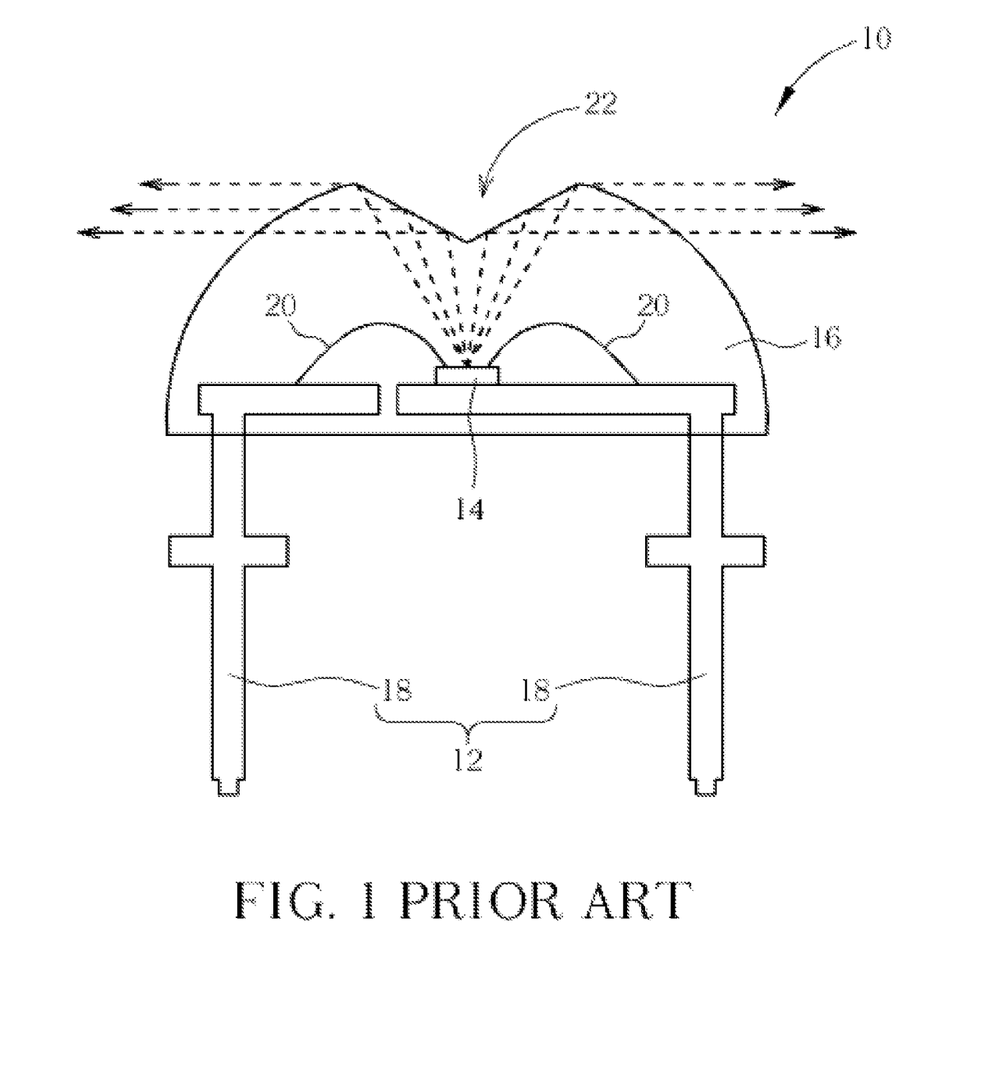
FIG. 1 is a cross-sectional schematic diagram illustrating a light-emitting device package structure applied to Christmas trees according to the prior art.

Referring to FIG. 1, FIG. 1 is a cross-sectional schematic diagram illustrating a light-emitting device package structure applied to Christmas trees according to the prior art. As shown in FIG. 1, the light-emitting device package structure 10 includes a leadframe 12, a light-emitting device 14 and an encapsulant 16. The leadframe 12 has two leads 18. The light-emitting device 14 is mounted on the leadframe 12, and an anode and a cathode of the light-emitting device 14 are electrically connected to the leads 18 by two respective wires 20. The encapsulant 16 is a hemispherical lens structure encapsulating the light-emitting device 14, and a center of a cambered surface of the hemispherical lens structure disposed on the light-emitting device 14 has a concavity with an upside down conoid shape. The light (indicated by the arrow shown in FIG. 1) emitted from the light-emitting device 14 can be reflected by the concavity 22 while passing though the concavity 22, and then emitted to an edge of the light-emitting device package structure 10. Therefore, a luminous angle is increased.

Figure 2:
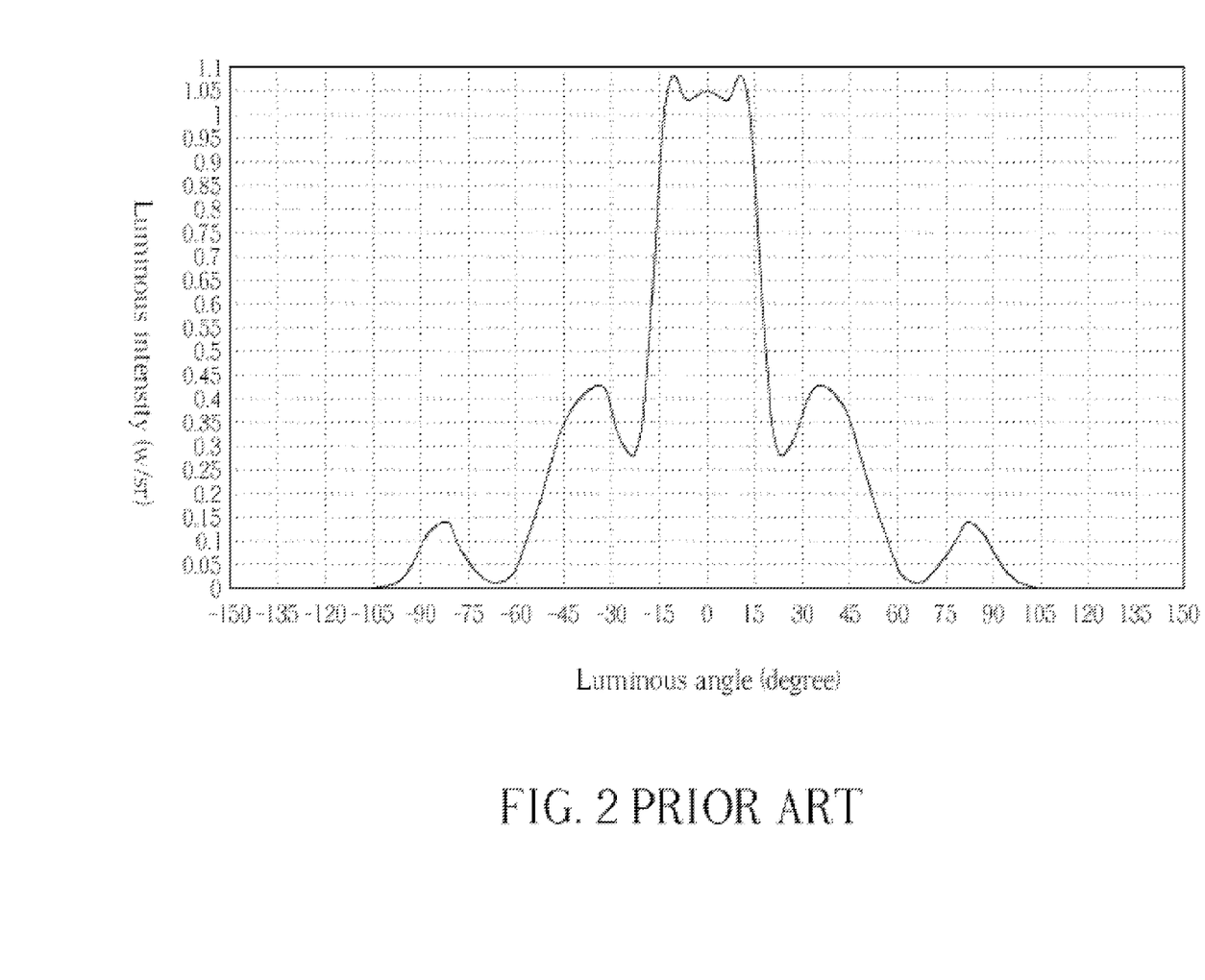
FIG. 2 is a schematic diagram illustrating a relation between luminous intensity and luminous angle of the light-emitting device package structure according to the prior art.

Referring to FIG. 2, FIG. 2 is a schematic diagram illustrating a relation between luminous intensity and luminous angle of the light-emitting device package structure according to the prior art. As shown in FIG. 2, the luminous intensity of the light-emitting device package structure can be detected at the luminous angle between positive 90 degrees and negative 90 degrees. This means that the light-emitting device package structure from the optical axis to 90 degrees deviated to the edge emits light, so that the light-emitting device package structure has a certain luminous intensity at the luminous angle from positive 90 degrees to negative 90 degrees. Therefore, when the light-emitting device package structure is disposed on the Christmas tree, the Christmas lamp can be clearly viewed from all kinds of angles below the Christmas tree.

Although the light-emitting device package structure according to the prior art can emit light at the luminous angle of 90 degrees, the luminous intensity at the optical axis of the light-emitting device package structure is reduced by the concavity. The reduced luminous intensity is substantially at the luminous angle between positive 20 degrees and negative 20 degrees. Therefore, when the light-emitting device package structure according to the prior art is applied to the Christmas tree, the viewing distance between the viewer and the Christmas tree is limited because of the limit of the luminous intensity of the light-emitting device package structure. To increase the luminous intensity at the optical axis of the light-emitting device package structure and to keep the luminous intensity at the edge of the light-emitting device package structure are important objectives to be achieved.

SUMMARY

It is therefore an objective of the present invention to provide a light-emitting device package structure and a manufacturing method thereof so as to increase the viewing distance of the Christmas lamp.

According to an embodiment of the present invention, the present invention discloses a light-emitting device package structure. The light-emitting device package structure comprises a leadframe, a light-emitting device, a plurality of wires and an encapsulant. The light-emitting device is disposed on the leadframe, and the light-emitting device has a main luminous surface. The wires electrically connect the leadframe and the light-emitting device. An encapsulant encapsulates the light-emitting device, the wires and a part of the leadframe, and an inside of the encapsulant has a gas space. The gas space is disposed on the main luminous surface of the light-emitting device, and the gas space comprises at least one gas.

According to another embodiment of the present invention, the present invention discloses a manufacturing method of a light-emitting device package structure. First, a light-emitting device structure is provided, wherein the light-emitting device structure comprises a first encapsulated portion, and a top surface of the first encapsulated portion has a concavity. Then, a colloid is injected into an encapsulating mold. Next, the light-emitting device structure is inserted into the encapsulating mold to form a gas space between the colloid and the first encapsulated portion, and the colloid covers the first encapsulated portion. Then, a baking process is performed to make the colloid form a second encapsulated portion outside the first encapsulated portion and to form the light-emitting device package structure.

The present invention forms the gas space inside the light-emitting device package structure in the encapsulation process by the concavity of the light-emitting device structure. Therefore, the light emitted from the light-emitting device can be partially reflected by the gas space, and the light passing through the gas space can be condensed by the second encapsulated portion. Therefore, not only the luminous intensity of at the center of the optical axis of the light-emitting device package structure can be increased, but the light-emitting device package structure can also have sufficient luminous intensity at the edge.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
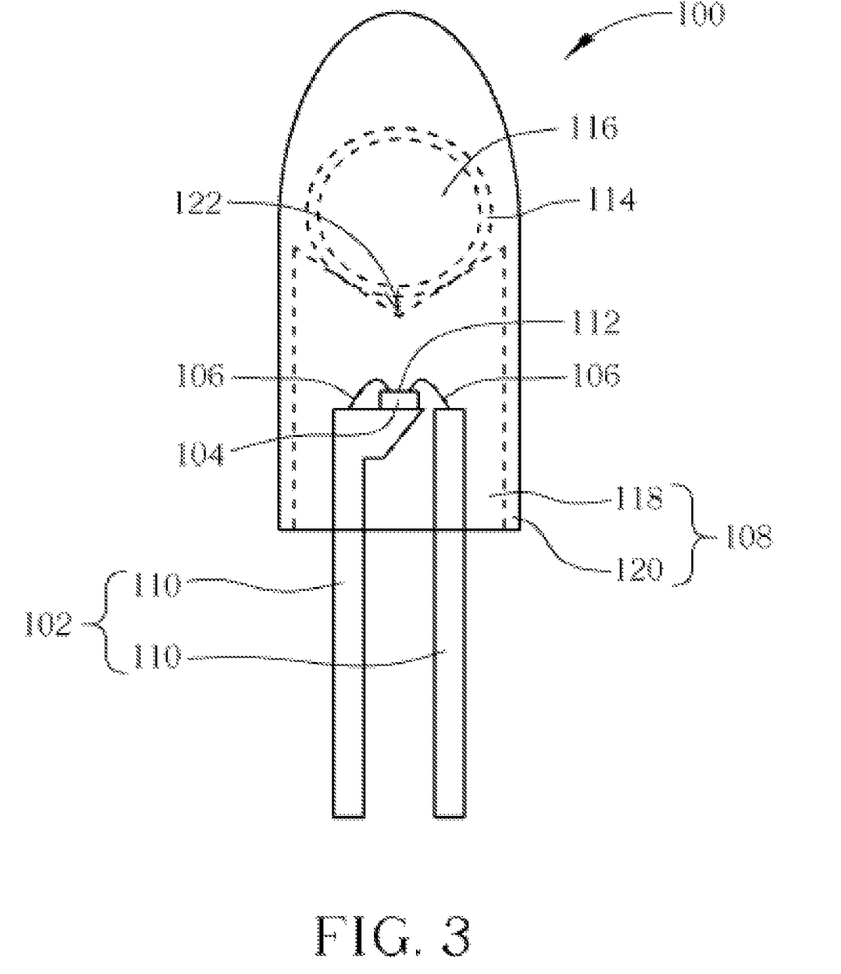
FIG. 3 is a cross-sectional schematic diagram illustrating a light-emitting device package structure according to a first embodiment of the present invention.

Referring to FIG. 3, FIG. 3 is a cross-sectional schematic diagram illustrating a light-emitting device package structure according to a first embodiment of the present invention. As shown in FIG. 3, the light-emitting device package structure 100 includes a leadframe 102, a light-emitting device 104, a plurality of wires 106, and an encapsulant 108. The leadframe 102 of this embodiment includes two leads 110, but the leadframe of the present invention is not limited to only have two leads. The number of leads can be increased according to the actual requirements. The light-emitting device 104 is disposed on one of the leads 110, and a top surface of the light-emitting device 104 is a main luminous surface. In addition, the light-emitting device 104 can be any kind of luminous device, such as a light emitting diode (LED) chip, LED device or organic LED device, etc. This embodiment takes the LED chip as an example, but this is not meant to be a limitation. Furthermore, each wire 106 electrically connects the light-emitting device 104 and each lead 110 respectively. The light-emitting device 104 can be supplied with a power source by the leads 110 so as to generate light. In addition, the encapsulant 108 encapsulates the light-emitting device 104, the wires 106 and a part of the leadframe 102 so as to protect the light-emitting device 104 and wires from being damaged by contact with the outside body or dust. The encapsulant 108 is a transparent solid, and has no fluidness. The encapsulant includes at least one package material, such as glass, quartz, resin with high transmittance, silicone, combinations thereof, or other suitable materials. The resin with high transmittance includes epoxy resin, polystyrene (PS), acrylonitrile-butadene-styrene (ABS), polymethyl methacrylate (PMMA), acrylic resin or combinations thereof.

In addition, the light-emitting device package structure 100 of this embodiment further includes a transparent shell 114 disposed inside the encapsulant 108. This means that the encapsulant 108 of this embodiment encapsulates the whole transparent shell 114, but the invention is not limited to this. The transparent shell 114 is disposed on the main luminous surface 112 of the light-emitting device 104. Furthermore, the inside of the transparent shell 114 has a gas space 116, and the gas space 116 includes at least one gas, such as air. It should be noted that the light emitted from the light-emitting device 104 can be reflected and refracted because of the difference between a refractive index of the transparent shell 114 and a refractive index of the gas in the gas space 116. For this reason, the top surface and the edge of the light-emitting device package structure 100 all emit the light. The top surface of the encapsulant 108 is a convex surface, such as a paraboloid or spherical surface with a concave hole oriented downward, and the light emitted from the top surface of the light-emitting device package structure 100 can be condensed by the convex surface to the outside. Therefore, the luminous intensity at the optical axis can be efficiently increased. The curvature of the convex surface is not limited to the paraboloid or the spherical surface, and the condensation can be adjusted correspondingly according to the actual requirements.

Furthermore, the transparent shell 114 is composed of transparent materials, such as glass, quartz, resin with high transmittance, silicone, or combinations thereof. The transparent shell 114 further can be composed of the same material as the encapsulant 108, and the transparent shell 114 and the encapsulant 108 can have a same refractive index, so that the light can regard the transparent shell 114 and the encapsulant 108 as a same dielectric, but the embodiment is not limited to this. The transparent shell 114 of the present invention can also be composed of materials different from the encapsulant 108 according to an actual required pattern of the light. It should be noted that refractive indexes of the transparent shell 114 and the encapsulant 108 should be larger than a refractive index of the gas in the gas space 116. A phenomenon of total reflection for the light at an interface between the transparent shell 114 and the encapsulant 108 or between the transparent shell 114 and the gas space 116 can be provided to have enough reflective light. In this embodiment, the transparent shell 114 is a spherical shell; that is, the gas space 116 disposed inside the transparent shell 114 is spherical. When the light passes through the transparent shell 114, a part of the light is reflected by the transparent shell 114, and emits from the edge of the light-emitting device package structure 100. The light-emitting device package structure 100 therefore has the edge light. The other part of the light passes through the transparent shell 114, and passes through the top surface of the encapsulant 108 so as to be condensed. Therefore, the luminous intensity of the light-emitting device package structure 100 at the optical axis can be increased. The transparent shell 114 of the present invention is not limited to be spherical, and a surface of the transparent shell 114 facing the light-emitting device 104 also can be conoid or a convex surface.

In this embodiment, the encapsulant 108 can include a first encapsulated portion 118 and a second encapsulated portion 120. The first encapsulated portion 118 encapsulates a part of the leadframe 102, the light-emitting device 104 and the wires 106, and the second encapsulated portion 120 covers a part of the first encapsulated portion 118. In addition, the transparent shell 114 is disposed between the first encapsulated portion 118 and the second encapsulated portion 120. It should be noted that the first encapsulated portion 118 has a concavity 122, and the concavity 122 faces the gas space 116 of the transparent shell 114. The shape of the concavity 122 can be an upside-down conoid shape, but the embodiment is not limited to this. Furthermore, the first encapsulated portion 118 and the second encapsulated portion 120 can be composed of same materials so as to have a same refractive index, but the embodiment is not limited to this. The first encapsulated portion 118 and the second encapsulated portion 120 of the present invention also can be composed of different materials, and the refractive indexes of the first encapsulated portion 118 and the second encapsulated portion 120 are larger than the refractive index of the gas in the gas space 116.

Figure 4:
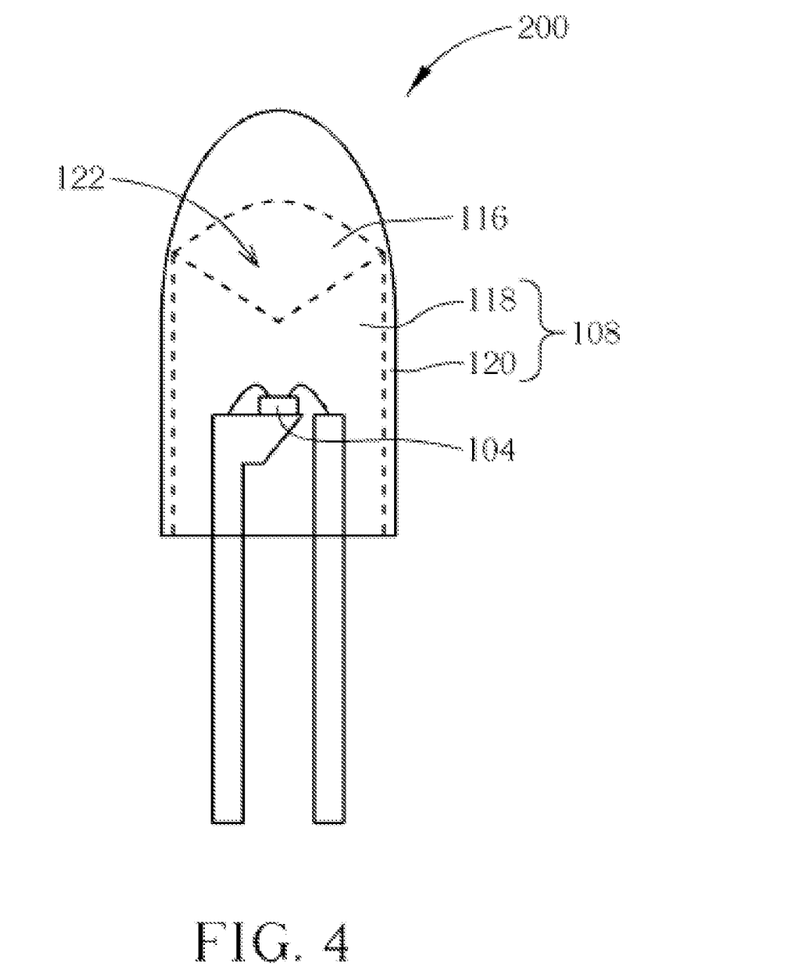
FIG. 4 is a cross-sectional schematic diagram illustrating a light-emitting device package structure according to a second embodiment of the present invention.

The light-emitting device package structure of the present invention is not limited to the structure of the above-mentioned embodiment, and the light-emitting device package structure of the present invention can also have no transparent shell. In order to clearly describe the difference between the following embodiments and the above-mentioned embodiment, devices use the same labels as the above-mentioned embodiment, and same structures will not be detailed redundantly. Referring to FIG. 4, FIG. 4 is a cross-sectional schematic diagram illustrating a light-emitting device package structure according to a second embodiment of the present invention. As shown in FIG. 4, compared with the first embodiment, the light-emitting device package structure 200 of this embodiment does not have the transparent shell, and the gas space 116 of this embodiment is a bubble encapsulated by the concavity 122 of the first encapsulated portion 118 and the second encapsulated portion 120 of the encapsulant 108. The gas space 116 is disposed inside the encapsulant 108, and is disposed on the light-emitting device 104. In addition, a shape of a side of the gas space 116 facing the first encapsulated portion 118 is the same as the shape of the concavity, and a shape of another side of the gas space 116 facing the second encapsulated portion 120 is a cambered surface.

Figure 5:
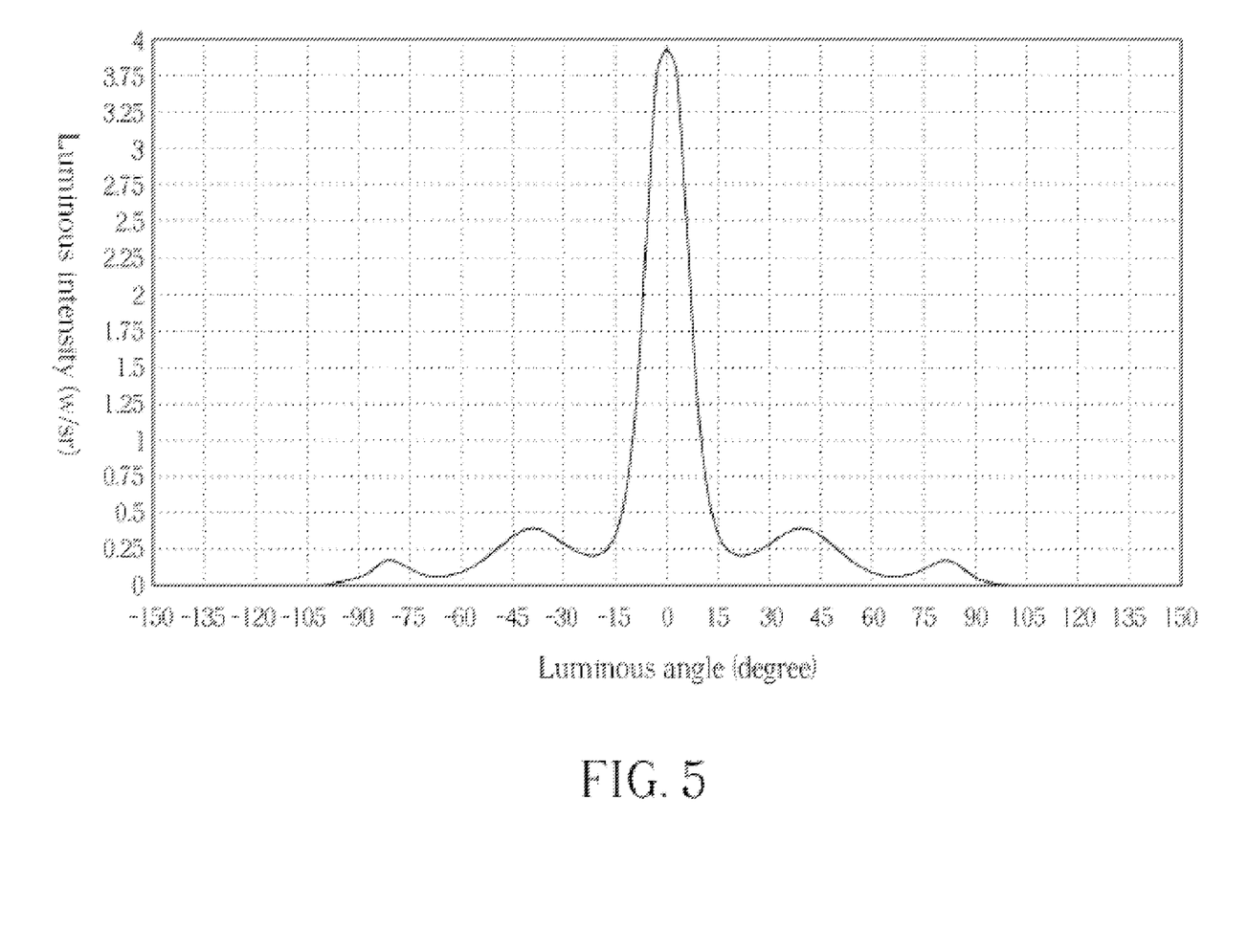
FIG. 5 is a schematic diagram illustrating a relation between luminous intensity and luminous angle of the light-emitting device package structure according to the first embodiment of the present invention.

In order to clearly describe the efficiency of the light-emitting device package structure of the present invention, the first embodiment is taken as an example. Referring to FIG. 5, FIG. 5 is a schematic diagram illustrating a relation between luminous intensity and luminous angle of the light-emitting device package structure according to the first embodiment of the present invention, and FIG. 2 is compared with FIG. 5. As shown in FIG. 5, the luminous intensity at zero degree of the light-emitting device package structure of the present invention, which is the luminous intensity at the optical axis, is substantially 4 Watts/solid angle (W/sr). As compared with FIG. 2, the luminous intensity at zero degrees of the light-emitting device package structure of the prior art is substantially 1.1 W/sr. Therefore, the luminous intensity at the optical axis of the light-emitting device package structure of the present invention is larger than that of the prior art. Furthermore, the luminous intensity of the light-emitting device package structure of the present invention can be detected to be substantially 0.15 W/sr, and is substantially the same as the luminous intensity of the light-emitting device package structure of the prior art, when the luminous angle is between positive 75 degrees and positive 90 degrees and between negative 75 degrees and negative 90 degrees. Therefore, the light-emitting device package structure of the present invention not only increases the luminous intensity at the optical axis, but also maintains the luminous intensity from the edge of the light-emitting device package structure so as to help to increase the viewing distance between the viewer and the Christmas lamp.

Figure 6:
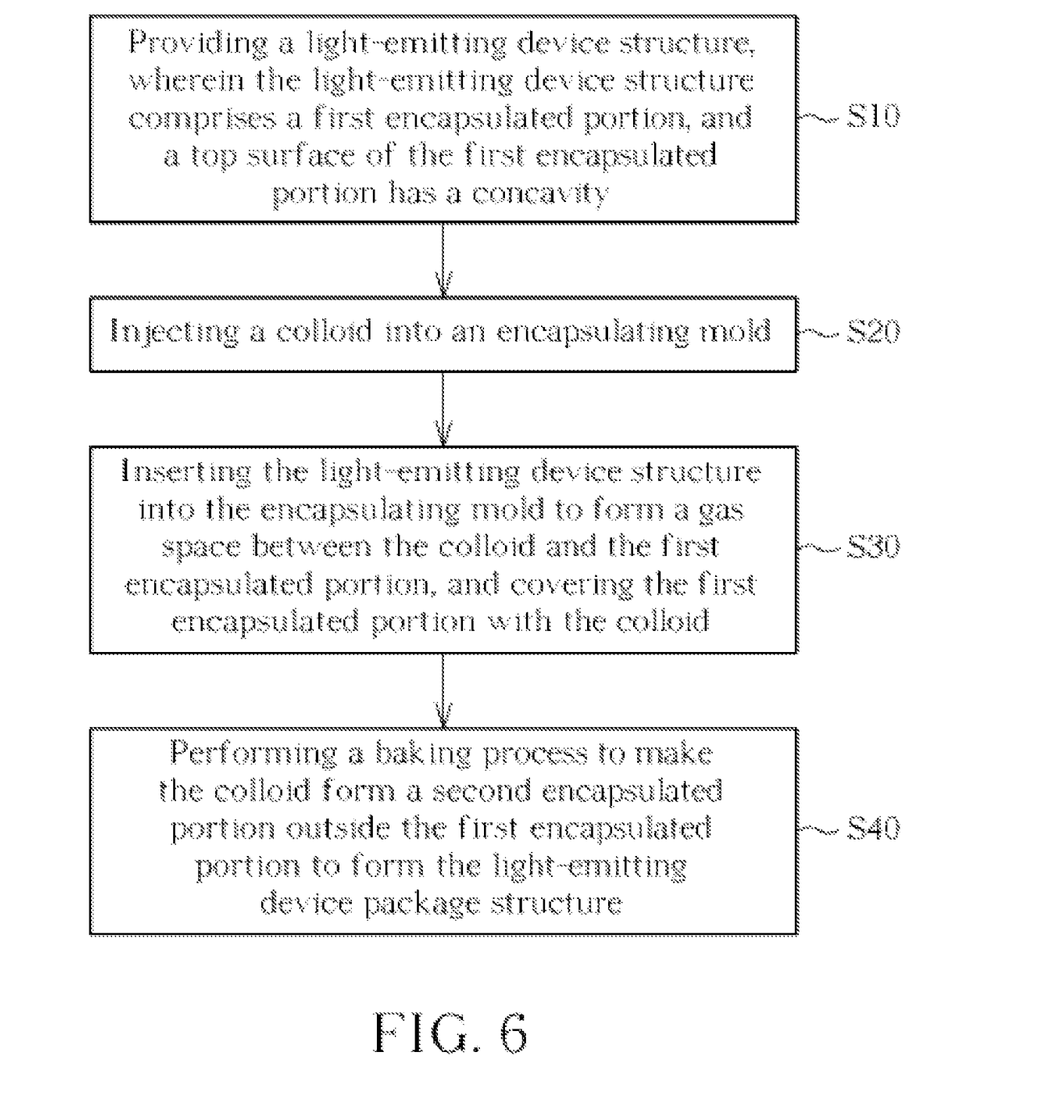
FIG. 6 is a flow chart illustrating a manufacturing method of the light-emitting device package structure of the present invention.

In addition, the present invention also provides a manufacturing method of the above-mentioned light-emitting device package structure. Referring to FIG. 6, FIG. 6 is a flow chart illustrating a manufacturing method of the light-emitting device package structure of the present invention. As shown in FIG. 6, the manufacturing method of the light-emitting device package structure comprises:

Step S10: providing a light-emitting device structure, wherein the light-emitting device structure comprises a first encapsulated portion, and a top surface of the first encapsulated portion has a concavity;

Step S20: injecting a colloid into an encapsulating mold;

Step S30: inserting the light-emitting device structure into the encapsulating mold to form a gas space between the colloid and the first encapsulated portion, and covering the first encapsulated portion with the colloid; and Step S40: performing a baking process to make the colloid form a second encapsulated portion outside the first encapsulated portion to form the light-emitting device package structure.

In step S10, the step of providing the light-emitting device structure comprises:

Step S102: bonding at least one light-emitting device on a leadframe;

Step S104: electrically connecting the light-emitting device and the leadframe with a plurality of wires; and Step S106: performing an encapsulation process to form the first encapsulated portion encapsulating the light-emitting device, the wires and a part of the leadframe.

Figure 7:
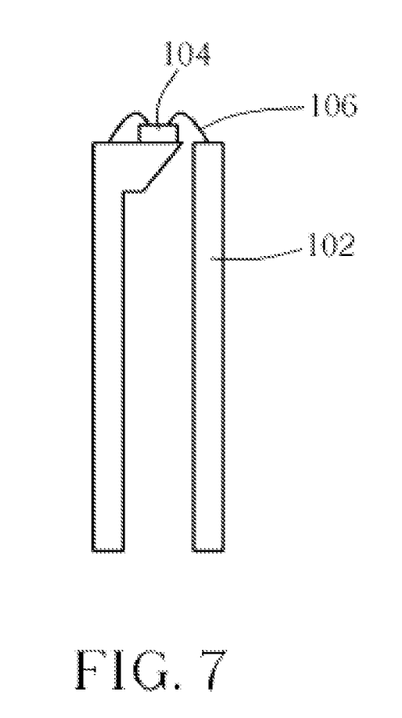
FIG. 7 through FIG. 10 are schematic diagrams illustrating the manufacturing method of the light-emitting device package structure according to the first embodiment of the present invention.

In order to clearly describe the manufacturing method of the light-emitting device package structure according to the first embodiment of the present invention, referring to FIGS. 7 through 10 and referring to FIG. 3 and FIG. 6, FIGS. 7 through 10 are schematic diagrams illustrating the manufacturing method of the light-emitting device package structure according to the first embodiment of the present invention. As shown in FIG. 7, in step S102, a light-emitting device 104 and a leadframe 102 is provided, and then, a die bonding process is performed to bond the light-emitting device 104 on the leadframe 102. Next, a wire bonding process is performed to electrically connect the light-emitting device 104 and the leadframe 102 with the wires 106.

Figure 8:
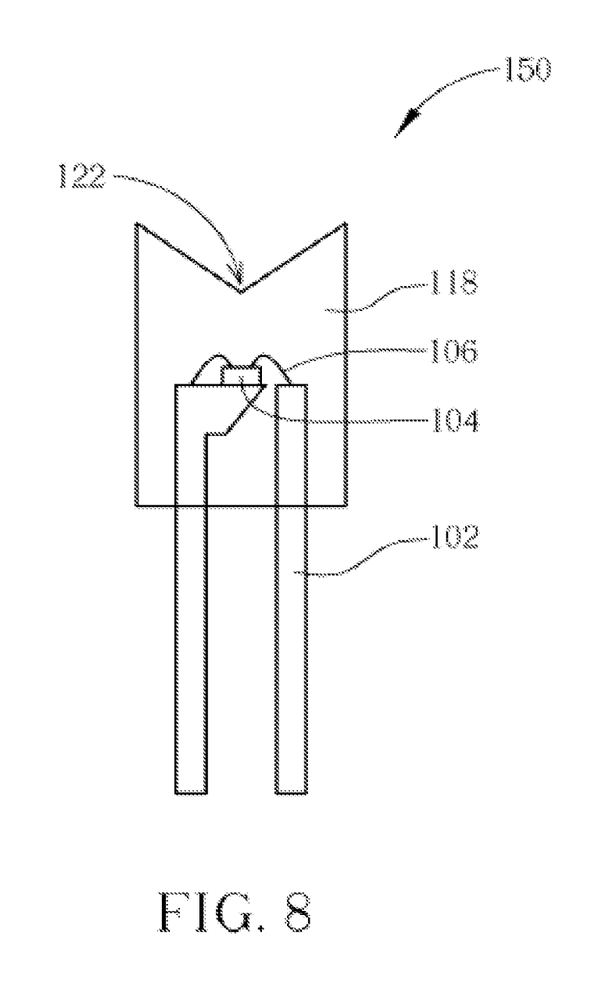

Thereafter, as shown in FIG. 8, in step S106, an encapsulation process is performed to form a first encapsulated portion 118 to encapsulate the light-emitting device 104, the wires 106 and a part of the leadframe 102, and then, a light-emitting device structure 150 is completed. A top surface of the first encapsulated portion 118 has at least one concavity 122. It should be noted that the light-emitting device structure 150 of this embodiment is a structure having a light-emitting device 104 and a first encapsulated portion 118. The light-emitting device structure 150 of the present invention can also be a semi-manufacturing product having a plurality of light-emitting devices encapsulated by the first encapsulated portion, and the light-emitting devices are disposed on the leadframe. Additionally, the light-emitting device structure 150 can be an edge lighting LED.

Figure 9:
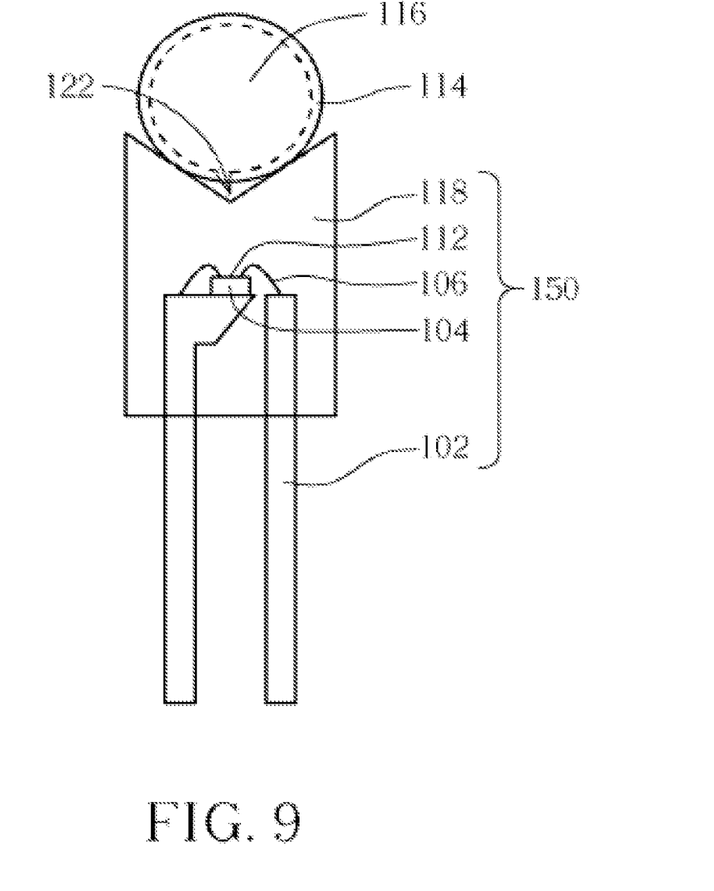

Then, as shown in FIG. 9, a transparent shell 114 is bonded on the concavity 122 of the light-emitting device structure 150. The gas space 116 is inside the transparent shell 114, and is disposed on the main luminous surface 112 of the light-emitting device 104.

Figure 10:
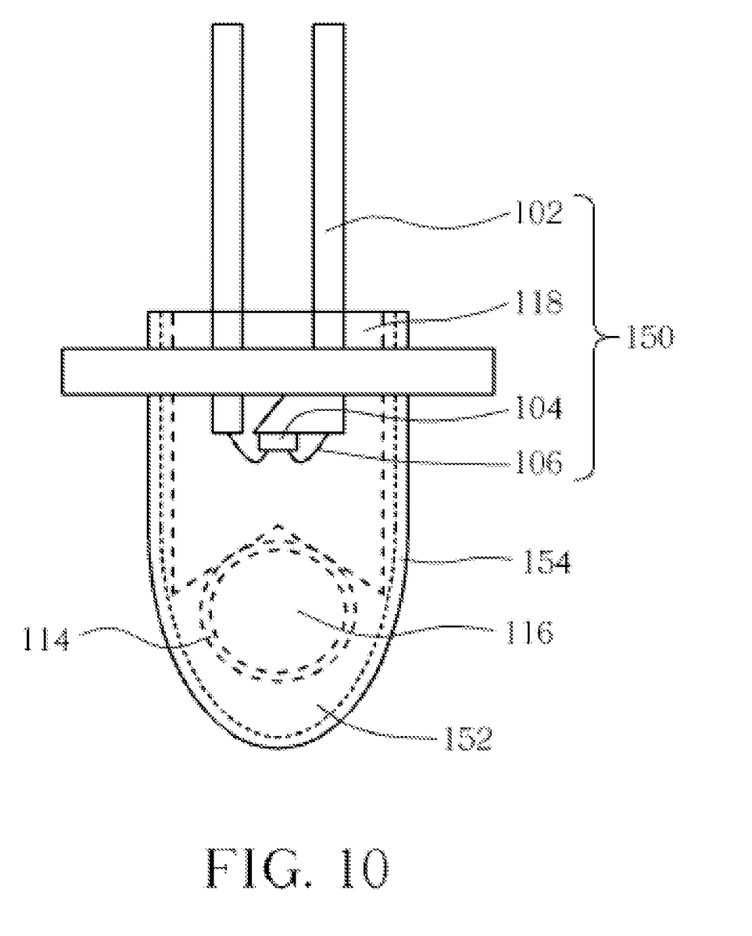

Next, as shown in FIG. 10, in step S20, another encapsulation process is performed to inject the colloid 152 into the encapsulating mold 154. In step S30, the light-emitting device structure 150 having the transparent shell 114 is disposed upside down, and is inserted to the colloid 152 in the encapsulating mold 154 so as to form the gas space 116 between the colloid 152 and the light-emitting device structure 150. The colloid 152 covers the transparent shell 114 and the first encapsulated portion 118 of the light-emitting device structure 150. In this embodiment, the transparent shell 114 is bonded on the concavity of the light-emitting device structure 150 between step S10 and step S20, so that the gas space 116 inside the transparent shell 114 can be formed between the colloid 152 and the light-emitting device structure 150.

Then, in step S40, a baking process is performed to form the second encapsulated portion 120 on the light-emitting device structure 150 with the colloid 152. Finally, the encapsulating mold 154 is removed to form the light-emitting device package structure 100 of the first embodiment shown in FIG. 3. The manufacturing method of the light-emitting device package structure of the present invention is not limited to only manufacturing a single light-emitting device package structure, and can also manufacture a plurality of the light-emitting device package structures at a time. While manufacturing the light-emitting device package structures, the manufacturing method further comprises a cutting process after the step of removing the encapsulating mold, and the cutting process is performed to form a single light-emitting device package structure.

Figure 11:
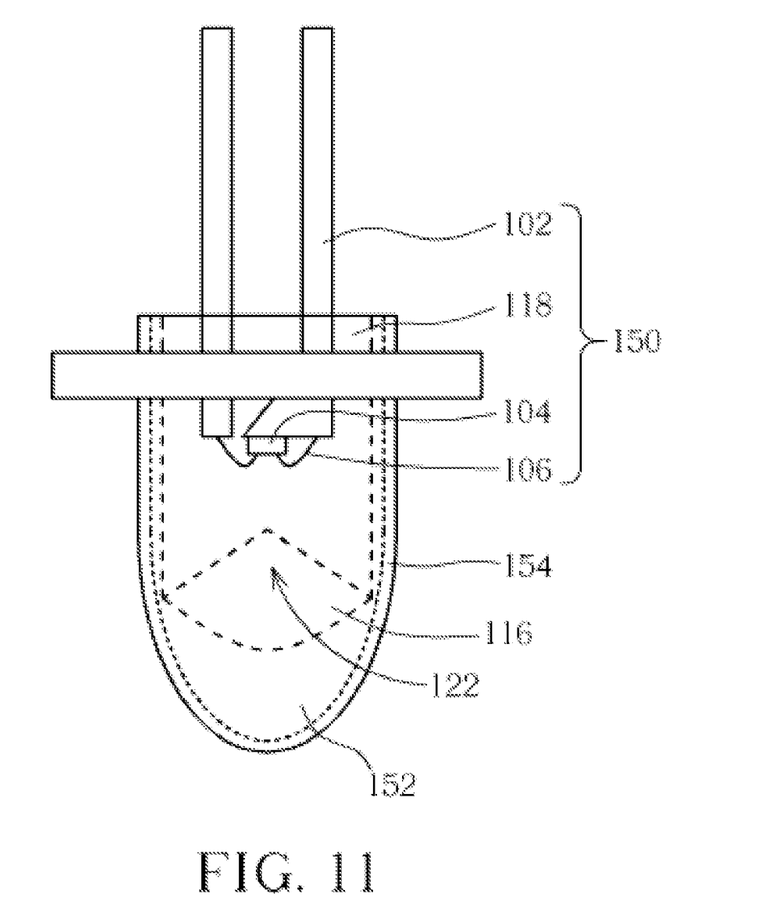
FIG. 11 is a schematic diagram illustrating the manufacturing method of the light-emitting device package structure according to the second embodiment of the present invention.

The present invention further provides a manufacturing method of the light-emitting device package structure of the second embodiment. Referring to FIG. 11 and referring to FIGS. 6 through 8, FIG. 10 and FIG. 4, FIG. 11 is schematic diagram illustrating the manufacturing method of the light-emitting device package structure according to the second embodiment of the present invention. As shown in FIGS. 6 through 8, compared with the manufacturing method of the first embodiment, the steps for forming the light-emitting device structure of the manufacturing method of this embodiment are the same as step S10 of the method of the first embodiment, and will not be detailed redundantly. Next, as shown in FIG. 10, in step S20, the encapsulation process is performed to inject a colloid 152 into an encapsulating mold 154, and then, in step S30, the light-emitting device structure 150 having the concavity 122 is disposed upside down and directly inserted into the colloid 152 in the encapsulating mold 154. The difference between the method for forming the gas space 116 of the first embodiment and the method of this embodiment is that this embodiment uses the concavity 122 of the first encapsulated portion 118 to reserve air in the concavity 122 during inserting the light-emitting device structure 150 into the colloid 152, and the gas space 116 can be formed between the colloid 152 and the light-emitting device structure 150. The gas space 116 of this embodiment is a bubble including air. Finally, in step S40, a baking process is performed to form the second encapsulated portion 120 outside the light-emitting device structure 150 with the colloid 152. Then, the encapsulating mold 154 is removed to form the light-emitting device package structure 200 of the second embodiment shown in FIG. 4.

As mentioned above, the present invention uses a two-step encapsulation process to form the gas space inside the light-emitting device package structure. The light emitted from the light-emitting device directly under the gas space can pass through the gas space, and a part of the light can be reflected to emit in the direction deviating from the optical axis by 90 degrees. In addition, the present invention provides the convex surface to be the top surface of the package structure. For this reason, the light passing through the gas space can be condensed, and the luminous intensity at the center of the optical axis of the light-emitting device package structure can be increased accordingly. Therefore, the present invention not only can increase the luminous intensity at the center of the optical axis of the light-emitting device package structure, but can also provide sufficient luminous intensity at the edge of the light-emitting device package structure so as to solve the problem of insufficient luminous intensity of the light-emitting device package structure of the prior art.

Those skilled in the art will readily observe that numerous modifications and alterations of the device and method may be made while retaining the teachings of the invention.

What is claimed is:

1. A light-emitting device package structure, comprising:
   a light-emitting device having a main luminous surface; and
   an encapsulant, the encapsulant encapsulating the light-emitting device and comprising:
      a first encapsulated portion;
      a second encapsulated portion covering a part of the first encapsulated portion such that a gas space is disposed between the first encapsulated portion and the second encapsulated portion; and
      at least one gas in the gas space,
      wherein an outer surface of the first encapsulated portion facing away from the light-emitting device has a concavity that forms a hollow to accommodate the gas space.

2. The light-emitting device package structure as recited in claim 1, wherein the gas space is disposed on the main luminous surface of the light-emitting device.

3. The light-emitting device package structure as recited in claim 1, wherein a shape of the concavity is an upside down conoid shape.

4. The light-emitting device package structure as recited in claim 1, wherein a top surface of the encapsulant is a convex surface.

5. The light-emitting device package structure as recited in claim 1, wherein a refractive index of the encapsulant is larger than a refractive index of the at least one gas.

6. The light-emitting device package structure as recited in claim 1, wherein a material of the first encapsulated portion and a material of the second encapsulated portion are different.

7. The light-emitting device package structure as recited in claim 1, wherein a material of the first encapsulated portion and a material of the second encapsulated portion are the same.

8. The light-emitting device package structure of claim 1, wherein the gas comprises air.

9. The light-emitting device package structure of claim 1, wherein the encapsulant includes glass, quartz, resin with high transmittance, silicone, or a combination thereof.

10. The light-emitting device package structure of claim 9, wherein the resin with high transmittance includes epoxy resin, polystyrene (PS), acrylonitrile-butadene-styrene (ABS), polymethyl methacrylate (PMMA), acrylic resin, or a combination thereof.

11. The light-emitting device package structure as recited in claim 1, further comprising:
    a leadframe; and
    a plurality of wires that electrically connect the leadframe and the light-emitting device.

12. The light-emitting device package structure as recited in claim 11, wherein the encapsulant encapsulates the wires and a part of the leadframe.

13. The light-emitting device package structure as recited in claim 1, further comprising:
    a transparent shell disposed between the first encapsulated portion and the second encapsulated portion.

14. The light-emitting device package structure as recited in claim 13, wherein the gas space is disposed inside the transparent shell.

15. The light-emitting device package structure as recited in claim 13, wherein a material of the transparent shell and a material of the encapsulant are the same.

16. The light-emitting device package structure as recited in claim 13, wherein a refractive index of the transparent shell and a refractive index of the encapsulant are the same.

17. The light-emitting device package structure as recited in claim 13, wherein a refractive index of the transparent shell is greater than a refractive index of the at least one gas.

18. The light-emitting device package structure as recited in claim 13, wherein the transparent shell is a spherical shell.

19. The light-emitting device package structure as recited in claim 13, wherein the transparent shell includes glass, quartz, resin with high transmittance, silicone, or a combination thereof.

* * * * *